(12) United States Patent
Grenouillet et al.

(10) Patent No.: US 11,944,022 B2
(45) Date of Patent: Mar. 26, 2024

(54) RESISTIVE MEMORY WITH A SWITCHING ZONE BETWEEN TWO DIELECTRIC REGIONS HAVING DIFFERENT DOPING AND/OR DIELECTRIC CONSTANTS

(71) Applicant: COMMISSARIAT A L'ENERGIE ATOMIQUE ET AUX ENERGIES ALTERNATIVES, Paris (FR)

(72) Inventors: Laurent Grenouillet, Grenoble (FR); Marios Barlas, Grenoble (FR); Etienne Nowak, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 261 days.

(21) Appl. No.: 17/446,328

(22) Filed: Aug. 30, 2021

(65) Prior Publication Data

US 2022/0069217 A1 Mar. 3, 2022

(30) Foreign Application Priority Data

Sep. 2, 2020 (FR) ...................................... 20 08916

(51) Int. Cl.
*H10N 70/00* (2023.01)
*G11C 13/00* (2006.01)
*H10B 63/00* (2023.01)

(52) U.S. Cl.
CPC ....... *H10N 70/883* (2023.02); *G11C 13/0002* (2013.01); *H10B 63/00* (2023.02); *H10N 70/841* (2023.02)

(58) Field of Classification Search
CPC .. H10N 70/883; H10N 70/841; H10N 70/066; H10N 70/826; H10N 70/8833; G11C 13/0002; H10B 63/00
See application file for complete search history.

(56) References Cited

U.S. PATENT DOCUMENTS

| 9,379,320 | B2 * | 6/2016 | Shingu .................. H10N 70/24 |
| 2009/0014710 | A1 | 1/2009 | Kawashima et al. |
| 2010/0200852 | A1 | 8/2010 | Kawashima et al. |
| 2010/0243983 | A1 | 9/2010 | Chiang et al. |
| 2010/0314602 | A1 | 12/2010 | Takano et al. |
| 2012/0063201 | A1 | 3/2012 | Hayakawa et al. |
| 2014/0021430 | A1 | 1/2014 | Takano et al. |

(Continued)

FOREIGN PATENT DOCUMENTS

FR 2 995 443 A1 3/2014

OTHER PUBLICATIONS

French Preliminary Search Report dated Apr. 30, 2021 in French Application 20 08916 filed on Sep. 2, 2020, 3 pages (with English Translation of Categories of Cited Documents).

(Continued)

*Primary Examiner* — Allison Bernstein
(74) *Attorney, Agent, or Firm* — Oblon, McClelland, Maier & Neustadt, L.L.P.

(57) ABSTRACT

A resistive memory cell may be provided with a first electrode and a second electrode arranged on either side of a dielectric layer and facing an interface between a first region and a second region, The first and second region may have different compositions in terms of doping and/or dielectric constant, so as to confine the zone of reversible creation of a conductive filament at the interface.

20 Claims, 9 Drawing Sheets

(56) References Cited

U.S. PATENT DOCUMENTS

2014/0070163 A1  3/2014  Nodin et al.
2015/0171318 A1  6/2015  Takano et al.

OTHER PUBLICATIONS

Hayakawa et al., "Highly reliable $TaO_x$ ReRAM with centralized filament for 28-nm embedded application", 2015 Symposium on VLSI Technology Digest of Technical Papers, 2015, 2 pages.
Barlas et al., "Improvement of $HfO_2$ based RRAM array performances by local Si implantation", IEEE, 2017, 4 pages.

* cited by examiner

RESISTIVE MEMORY WITH A SWITCHING ZONE BETWEEN TWO DIELECTRIC REGIONS HAVING DIFFERENT DOPING AND/OR DIELECTRIC CONSTANTS

CROSS-REFERENCE TO RELATED APPLICATIONS

The present application claims the benefit of the filing date of French Appl. No. 2008916, filed on Sep. 2, 2020.

TECHNICAL FIELD AND PRIOR ART

The present invention relates to the field of non-volatile resistive memories and in particular that of the resistive memories containing oxide such as OxRAM (for Oxide resistive Random-Access Memory) memories.

Resistive memories are based on the reversible formation and breaking of a conductive filament in a zone called "switching zone" of a material that is normally insulating and can be forced to be conductive by forming a conduction path or a conductive filament after the application of a sufficiently high voltage. In the particular case of the memories containing oxide, the conductive filament is made from oxygen gaps in an insulating material containing oxide, typically a metal oxide such as $HfO_2$.

A writing voltage is used to make the switching zone of the dielectric layer go into a "low resistance" state, while an erasing voltage is used to make this zone go into a "high resistance" state.

When the memory cell is in its state just after manufacturing, called "original state", and has not yet undergone a writing cycle, the switching zone is formed for the first time by applying to the memory cell a "forming" voltage greater than the writing voltage. Then, the memory cell enters into a normal operating mode in which the writing voltage and the erasing voltage are used to switch the state of resistance of the memory cell from a state of high resistance to a state of low resistance and vice versa.

The confinement of the switching zone to a precise location of the dielectric material poses a problem.

In certain cases because of the etching methods which are capable of introducing oxidised zones or defects (non-stoichiometry, introduction of species coming from a plasma, . . . ) at the outer edges of the cell parasite conductive paths are capable of being formed near these edges.

To overcome this problem, it is known from the document HAYAKAWA Y. et al. 'Highly reliable TaOx ReRAM with centralized filament for 28-nm embedded application', 2015 Symposium on VLSI Technology, Kyoto, ISSN 0743-1562 to carry out a lateral oxidation and to provide an encapsulation of the memory cell with zones of nitride.

Another solution for improving the confinement of the switching zone is to act on the "forming" voltage by adapting the duration and the amplitude of the pulses.

In the document US2010/0243983A1, an implantation of the regions with a layer of oxide is carried out in such a way as to create defects in these regions and try to favour the switching zone in the implanted regions.

In general, it is sought to obtain a more precise location of the switching zone. There is also the problem of reducing the forming voltage. There is also the problem of reducing the dimensions of the resistive memory cells.

DISCLOSURE OF THE INVENTION

The present invention aims to solve at least one of the problems mentioned above and provides according to one embodiment a resistive memory structure provided with at least one memory cell including a first electrode and a second electrode arranged on either side of a dielectric layer, the memory cell being capable of reversibly switching between a "high resistance" state and a "low resistance" state, the dielectric layer including a switching zone forming a preferred conduction path for the current when the memory cell is in said low resistance state, the dielectric layer including a first region and a second region joined at an interface, the first and second region being made of the same dielectric material with different respective compositions in terms of doping element(s) or concentration of doping element or being respectively made of a first dielectric material and a second dielectric material having different respective dielectric constants, the first electrode and the second electrode being arranged facing the interface between the first region and the second region, the interface extending in a given plane passing through the dielectric layer and passing through the electrodes so as to locate the switching zone at the interface zone.

The inventors discovered that with such an interface and such an arrangement of electrodes with respect to this interface, an exacerbation of the radial electric field at the interface could be implemented and that a confinement of the conductive filament at the interface could thus be obtained.

Besides the fact of allowing to obtain better confinement of the switching zone, such a cell has the advantage of being able to operate at low levels of forming voltage.

Advantageously, the first region extends, in a direction parallel to a main plane of the dielectric layer, between the interface and a zone located facing a first lateral face of at least one given electrode out of the first electrode and the second electrode, the second region extending, in a direction parallel to a main plane of the dielectric layer, between the interface and another zone facing a second lateral face of the given electrode opposite to the first lateral face.

According to one implementation possibility, at least one given electrode out of the first electrode and the second electrode can be centred facing the interface zone and extends facing a surface of the first region equal or substantially equal to a surface of the second region facing which this given electrode extends.

According to a specific embodiment, the dielectric layer can include an alternation of regions of a first type having a composition identical to the first region and regions of a second type and having the same composition as the second region, at least one given electrode out of the first electrode and second electrode being facing a single interface between a region of the first type and a region of the second type.

According to a specific embodiment, the resistive memory structure can further comprise:

a third electrode juxtaposed with, and distinct from, said second electrode, the third electrode being arranged facing another interface between said first region and a third region of said dielectric layer, said third region being juxtaposed with the first region and disposed so that the first region is located between the third region and the second region, the first region and the third region being made of the same dielectric material and having different compositions in terms of doping element(s) or concentration of doping element or being respectively made of a first dielectric material and a second dielectric material having different respective dielectric constants.

The second region and the third region can be made of the same dielectric material. According to one implementation possibility, the memory can further comprise a fourth electrode juxtaposed with the second electrode and distinct from the third electrode, the fourth electrode being arranged facing another interface zone between the third region and a fourth region of the dielectric layer, the fourth region being juxtaposed with the third region, and disposed so that the third region is located between the fourth region and the second region, the fourth region containing the same material as the first region. Advantageously, the dielectric layer can be a layer of oxide, in particular of oxide of transition metal, the first region being a doped region of the layer of oxide using a first doping element, in particular silicon or aluminium, present according to a first atomic concentration, the second region being a non-doped region of the oxide, or said second region being a doped region of the oxide and including a second atomic concentration of the first doping element distinct from the first concentration, or the second region being doped via a second doping element, such as aluminium or silicon, that is distinct from the first doping element.

According to a specific embodiment, the first region is made of hafnium oxide doped with silicon or doped with aluminium, the second region being:

made of non-doped hafnium oxide, or made of hafnium oxide doped with silicon with a concentration of silicon lower than the concentration of silicon of said first region, made of hafnium oxide doped with silicon when the first region is made of hafnium oxide doped with aluminium.

According to one implementation possibility, the dielectric layer is a layer of oxide containing one of the following oxides: hafnium oxide ($HfO_2$, $HfO_x$), tantalum oxide ($Ta_2O_5$, $Ta_xO_y$), tungsten oxide ($WO_x$), silicon oxide ($SiO_2$, $SiO_x$).

Advantageously, the first electrode extends in a direction parallel to a first direction, the second electrode and the third electrode extending in a direction parallel to the second direction, the second direction being orthogonal to the first direction.

According to another aspect, the present application relates to a method for creating a memory structure as defined above and in which the dielectric layer is a layer of oxide of a transition metal, the method comprising steps of:

implanting, using silicon or aluminium, the layer of dielectric material, in such a way as to create the first region, forming on the layer of dielectric material the second electrode facing an interface zone between the first region and another zone that is non-doped or has a doping different than that of the first region.

According to another possibility, the present application relates to a method for creating a memory structure as defined above and in which the layer is a layer containing a first dielectric material, the method comprising steps of:

forming one or more openings in the layer containing the first dielectric material, filling the opening(s) using a second dielectric material different than the first dielectric material.

Before the formation of the dielectric layer, the method also typically comprises: one or more steps of depositing one or more first conductive layer(s) to form the first electrode. Preferably, the method can further comprise, after the formation of the dielectric layer, one or more steps of depositing one or more second conductive layer(s) to form the second electrode.

BRIEF DESCRIPTION OF THE DRAWINGS

The present invention will be better understood on the basis of the following description and the appended drawings in which.

Identical, similar or equivalent parts of the various drawings carry the same numerical references so as to facilitate the passage from one drawing to another.

The various parts shown in the drawings are not necessarily according to a uniform scale, to make the drawings more readable.

Moreover, in the description below, terms that depend on the orientation, such as "vertical", "lateral", "greater", "lesser", etc., of a structure apply while considering that the structure is oriented in the way illustrated in the drawings.

DETAILED DISCLOSURE OF SPECIFIC EMBODIMENTS

Figure 1:
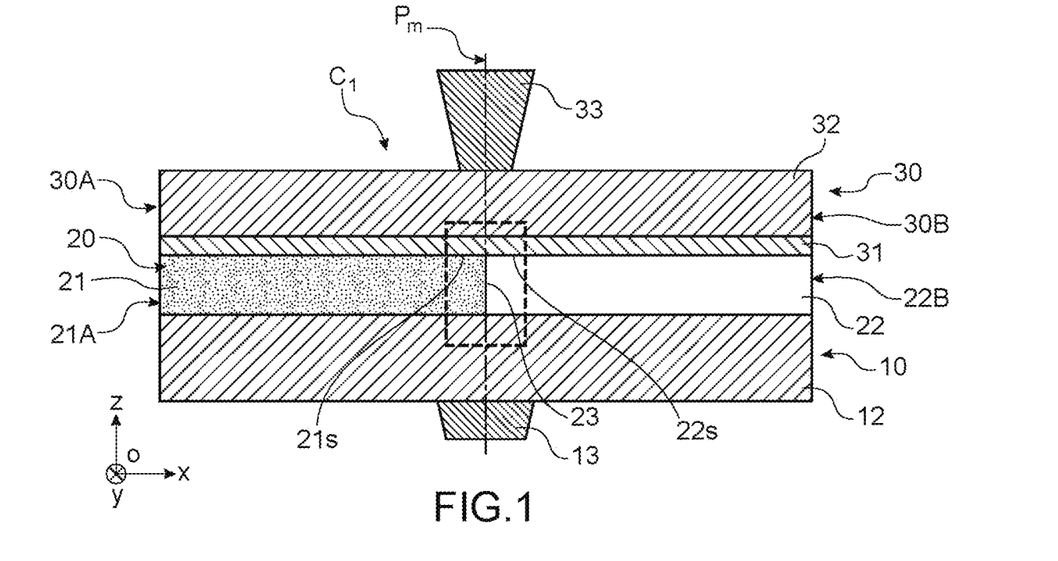
FIG. 1 is used to illustrate a specific arrangement of a resistive memory cell with a switching zone confined at an interface between a first and a second dielectric region having different compositions.

An example of a structure of a resistive memory cell $C_1$ according to an embodiment of the present invention is given in FIG. 1.

The resistive and non-volatile memory cell $C_1$, for example of the OxRAM type, belongs to a memory array that is typically provided with a plurality of cells (not shown). The memory array is formed in thin layers on a support (not shown) such as a semiconductor substrate or a substrate of the semiconductor on insulator type.

The memory array can be integrated into a lower stage of a microelectronic device and made in particular during steps of the "FEOL" (for Front-End-Of-Line) type, that is to say at the beginning of a method for manufacturing the microelectronic device, the stage thus being located at the transistors stage. Alternatively, the memory array can be integrated above a metal interconnection layer or between metal interconnection levels, during MEOL (for Middle-End-Of-Line) or BEOL-type (for Back-End-Of-Line) steps.

In the latter case, in which the memory is located at metal interconnections, the memory cells can be integrated for example between a fifth stage ("metal 5") of connection lines and a sixth stage ("metal 6") of connection lines or between a fourth stage ("metal 4") and a fifth stage ("metal 5").

The resistive memory cell $C_1$ includes a first electrode 10, a second electrode 30 and a layer 20 of dielectric material disposed between the first electrode 10 and the second electrode 30. The first electrode 10 is, in this example, called "lower" electrode, while the second electrode 30 is called "upper" electrode, the terms "lower" and "upper" being used here to characterise the position of the electrodes in the reference frame of the drawings.

The memory cell $C_1$ has, just like a conventional resistive memory cell, an operation allowing it to reversibly switch between two states of resistance according to the voltage applied to its electrodes 10, 30.

The memory cell $C_1$ is thus capable of reversibly switching between a "high resistance" state and a "low resistance" state. The dielectric layer 20 includes a "switching" zone in which a preferred conduction path for the current called conductive filament is capable of being created when a suitable voltage is applied to the electrodes 10, 30. The memory cell $C_1$ is thus in a low resistance state, a state in which a current for example between 5 µA and 25 µA is capable of passing through it.

By applying a suitable erasing voltage between the electrodes 10, 30, at least a part of the conduction path can be eliminated or altered. The cell $C_1$ is thus in a high resistance state with a weaker current, for example less than 10 µA, than in the low resistance state and for example between 1 µA and 10 µA.

The reading current that passes through the cell when it is read depends on the reading voltage applied, the reading voltage being, for the current values given above, typically between 0.05V and 0.4V.

The electrodes 10, 30 are each formed by one or more conductive layers and can include one or more conductive materials such as titanium nitride, titanium, tungsten. At least one of the electrodes, in this example the upper electrode 30, is provided with a layer 31 of oxygen scavenger material, in other words having a high affinity for oxygen for example such as titanium (Ti), tantalum (Ta), or hafnium (Hf). This layer 31 is disposed here in contact with the dielectric layer 20. The electrodes 10, 30 are typically formed by layers 12, 32 made of conductive material that can also be a barrier for diffusion of metal towards the dielectric layer such as TaN or TiN. In this example, conductive contacts 13, 33 made of metal, for example such as tungsten, are also provided.

The layer of dielectric material 20 can be a layer containing oxide or containing oxide regions, preferably an oxide of a transition metal for example such as an $HfO_2$ or $HfO_x$ hafnium oxide, or a $Ta_2O_5$ or $Ta_xO_y$ tantalum oxide, or a $WO_x$ tungsten oxide. The oxide layer 20 can also contain or include silicon oxide. Optionally, the layer of dielectric material 20 can include several superimposed sublayers of oxides.

When it is made of hafnium oxide, the layer 20 of dielectric material can be provided with a thickness of between 3 nm and 20 nm, preferably between 5 nm and 10 nm.

Rather than establishing a switching zone at the centre of a doped region of the dielectric layer in which charges were created, the inventors discovered, surprisingly, that a spatial confinement of the conductive filament could be obtained at an interface zone 23 between adjoining dielectric regions 21, 22 having different compositions, in particular in terms of doping and/or dielectric constant.

The cell $C_1$ thus has here the particularity of having a switching zone, in other words a zone of formation of a conductive filament, that is located at an interface 23 between two distinct dielectric regions 21, 22 in contact with one another. These distinct regions 21, 22 of the layer of dielectric material 20 can be regions of the same dielectric material but with different respective doping or consist of different dielectric materials with different respective dielectric constants.

Thus, according to one implementation possibility, a first region 21 of the dielectric layer 20 includes a doping element, typically silicon or aluminium, according to an atomic concentration of doping element or a given density of doping element, while a second region 22 of the dielectric layer 20 is non-doped or is also doped but with a lower atomic concentration of said doping element than in the first region 21.

When the first region 21 is a region made of oxide, in particular made of oxide of transition metal doped with silicon, there can be an atomic concentration of doping element between 0.1% and 5%, advantageously between 0.3% and 2%, and preferably between 0.5% and 1.5%.

In the case in which the first region 21 and the second region 22 are both doped with silicon, there can be a difference in concentration preferably greater than 0.3%.

When the first region 21 is a region made of oxide doped with aluminium, there can be an atomic concentration of doping element preferably greater than 1%, for example between 1% and 5%. In the case in which the first region 21 and the second region 22 are both doped with aluminium there can be a difference in concentration preferably greater than 0.3%.

Thus, a specific example of composition of the dielectric layer 20 provides a first region 21 containing hafnium oxide doped with silicon ($HfO_2$:Si) or with aluminium, while the second region 22 is made of hafnium oxide not doped or with a concentration of dopants, in particular of silicon or of aluminium, lower than that of the first region 21.

According to another example, the first region 21 can contain tantalum oxide ($Ta_2O_5$:Si, $TaO_x$:Si) doped with silicon while the second region 22 is made of tantalum oxide not doped or with a concentration of silicon lower than that of the first region 21.

A third example of composition provides a first region 21 made of silicon oxide doped with hafnium while the second region 22 is made of silicon oxide not doped or doped for example with hafnium and including a concentration of hafnium lower than that of the first region 21.

Alternatively, the regions 21, 22 can be regions of the same oxide of a transition metal, but doped with different species. In this case, a specific embodiment provides a first region 21 containing hafnium oxide doped with silicon, while the second region 22 is made of hafnium doped with aluminium.

According to another alternative, the regions 21, 22 can be regions containing different dielectric materials and having different dielectric constants. An example of a specific embodiment of this alternative provides the second region 22 made of a dielectric material of the type commonly called "high-k", in other words with a dielectric constant greater than that of silicon oxide, in particular an oxide of a transition metal for example hafnium oxide, and the first region 21 containing another dielectric material, for example $SiO_2$ or silicon nitride ($Si_xN_y$), a dielectric material of the type commonly called "low-k" (dielectric constant lower than that of silicon oxide).

To dispose the switching zone at the interface 23 between the regions 21, 22 of the dielectric layer 20, the electrodes 10, 30 are arranged facing this interface 23. The interface 23 extends in a plane $P_m$ passing through the dielectric layer 20 and passing through the electrodes 10, 30.

In the specific embodiment illustrated, the plane $P_m$ in which the interface 23 extends can form a median plane of the upper 10 and/or lower 30 electrode. "Median plane" means here a vertical plane dividing into two substantially equal parts the lower and/or upper electrode. "Vertical plane" means a plane that extends in parallel to the axis z of the orthogonal reference frame [O; x; y; z] given in FIG. 1.

The arrangement of the regions 21, 22 facing the electrodes can be such that the first dielectric region 21 extends in a direction parallel to a main plane of the dielectric layer 20, from said interface 23 at least to a zone 21A located facing a first lateral face 30A defining at least one of the electrodes 20, 30, here the upper electrode 30. As for the second dielectric region 22, it extends in a direction parallel to a main plane of the dielectric layer 20 between said interface 23 and a zone 22B in the extension of a second lateral face 30B defining said upper electrode 30 and which is opposite to said first lateral face 30A. "Main plane" of the dielectric layer 20 means a plane passing through this dielectric layer 20 and which extends along this dielectric layer 20 in parallel to the plane [O; x; y] of the orthogonal reference frame [O; x; y; z] given in FIG. 1.

The arrangement of the dielectric regions 21, 22 can be advantageously provided like in the example illustrated in FIG. 1 with a single interface 23 between regions 21, 22 having different compositions, the cell $C_1$ thus including a single switching zone facing the upper electrode 30. This can allow to reduce the electricity consumption and the level of the reading, writing, erasing voltages applied with respect to a cell in which there are several switching zones facing the same electrode 30.

Figure 2A:
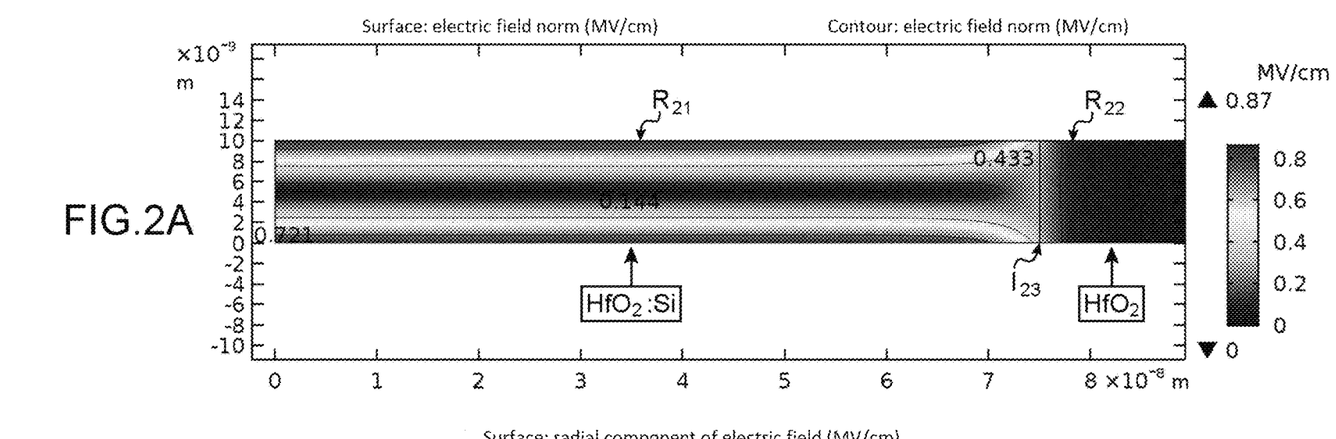
FIGS. 2A-2B are used to illustrate an exacerbation of the radial electric field at the interface formed between two dielectric regions having different compositions in a cell using an arrangement according to the invention.
Figure 2B:
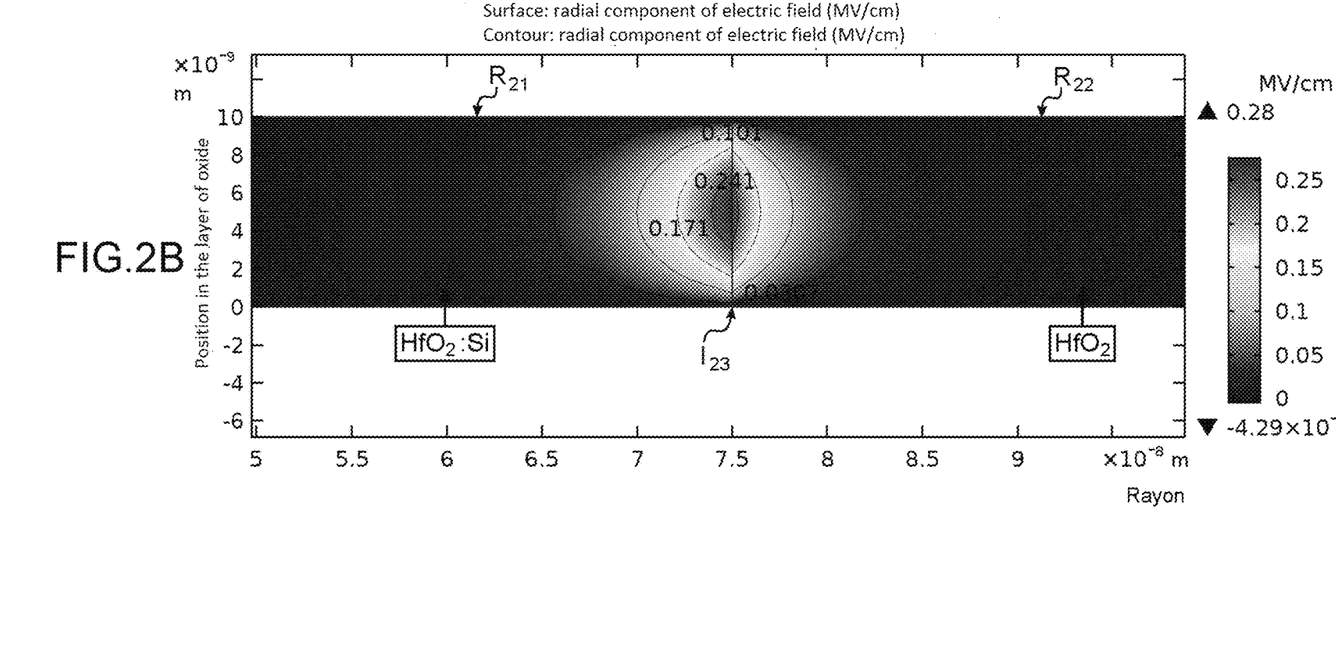

Advantageously, at least one of the electrodes is centred facing the interface zone 23, which allows to favour even more the confinement of the conductive filament at the interface 23 between the regions 21, 22. Thus, at least one of the electrodes, in this example the upper electrode 30, extends facing a surface 21s of the first region 21 equal or substantially equal to a surface 22s of the second region 22 facing which it extends. FIGS. 2A-2B give results of simulations obtained using the COMSOL Multiphysics Tool respectively on an axial component and a radial component of electric field in the dielectric layer of a cell structure of the type of that described above.

The electrodes are in particular arranged facing an interface between a first region $R_{21}$ made of hafnium oxide doped with silicon and a second region $R_{22}$ made of non-doped hafnium oxide. The greatest radial component of the electric field at the interface $I_{23}$ between the region that is not charged and not doped with silicon and the charged region shows that a greater current density is obtained at this interface $I_{23}$ and, consequently, an effect of confinement of the conductive filament is obtained.

Figure 3:
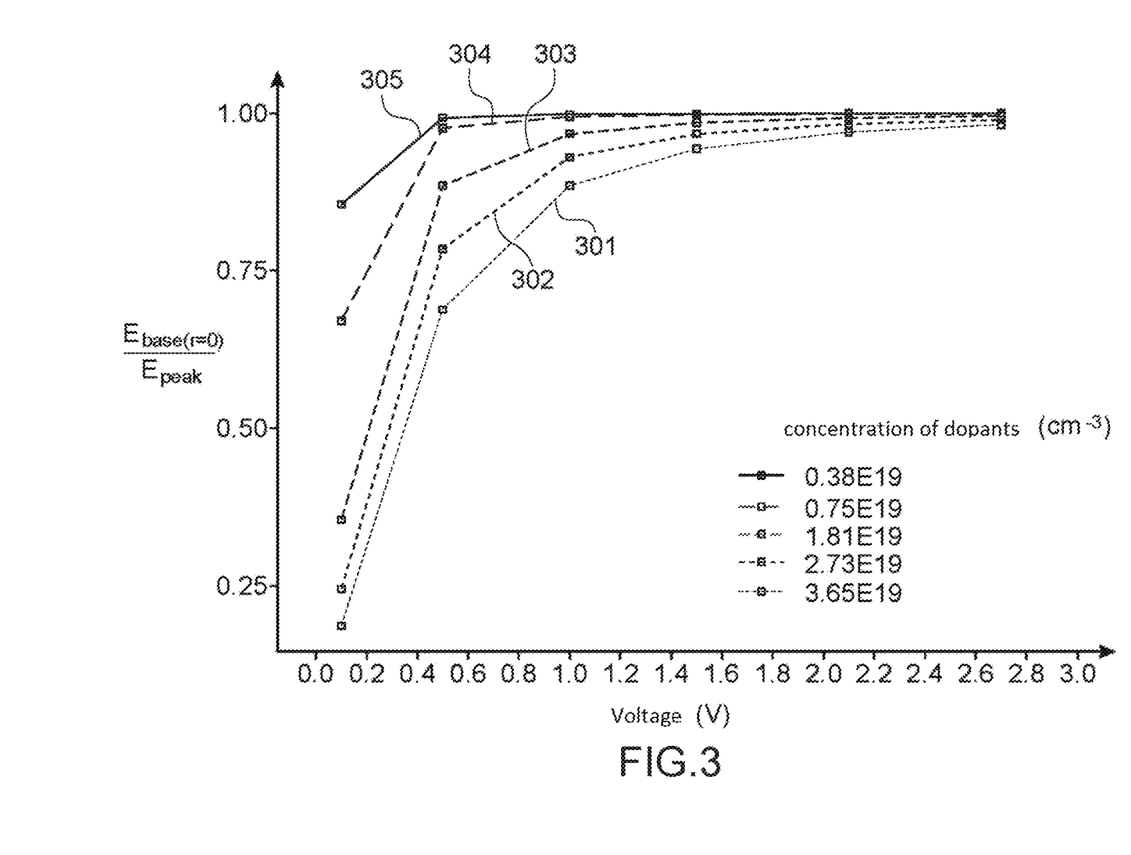
FIG. 3 gives examples of ranges of forming voltages for various levels of doping of a dielectric region of a cell using an arrangement according to the invention.

In FIG. 3, various curves 301, 302, 303, 304, 305 are representative of the reference radial electric field ratio at the interface and of radial electric field when moving away from this interface according to the forming voltage applied to the electrodes, respectively for various concentrations of dopants (respectively 3.65E19 $cm^{-3}$, 2.73E19 $cm^{-3}$, 1.81E19 $cm^{-3}$, 0.75E19 $cm^{-3}$, 0.38E19 $cm^{-3}$) of the first region of a cell structure such as that described above, this first region being made of a dielectric material having a dielectric constant $k_1$=19.2, while the second region is non-doped with a dielectric constant $k_2$=20. It is observed here that a cell arranged according to the invention allows to operate at levels of forming voltages between 0.5 volts and 1.5 volts, in other words at levels of voltages lower than those of the devices according to the prior art.

Figure 4A:
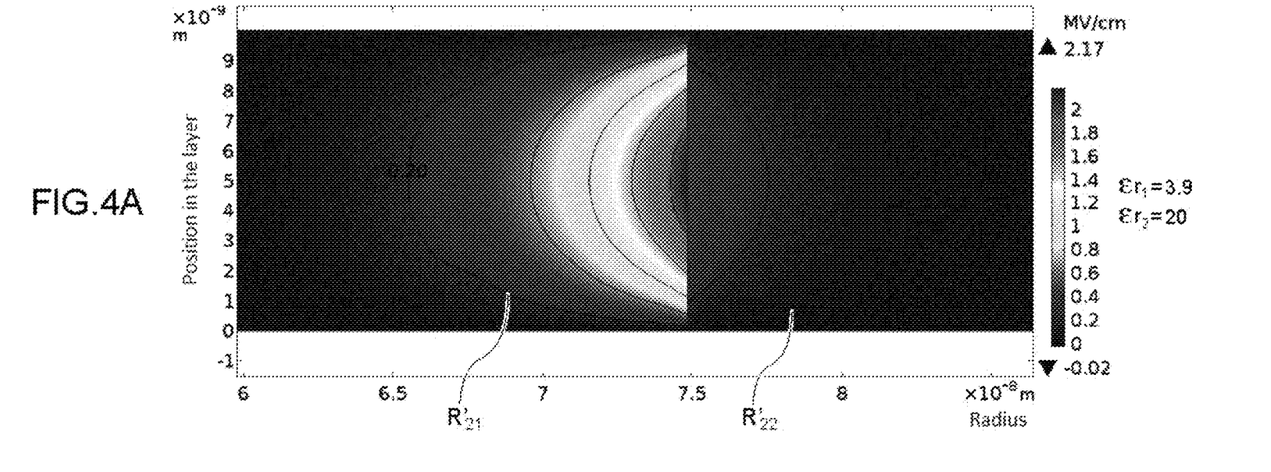
FIGS. 4A-4B are used to illustrate an exacerbation of the radial electric field at the interface formed between two dielectric regions having different dielectric constants in a cell using an arrangement according to the invention.
Figure 4B:
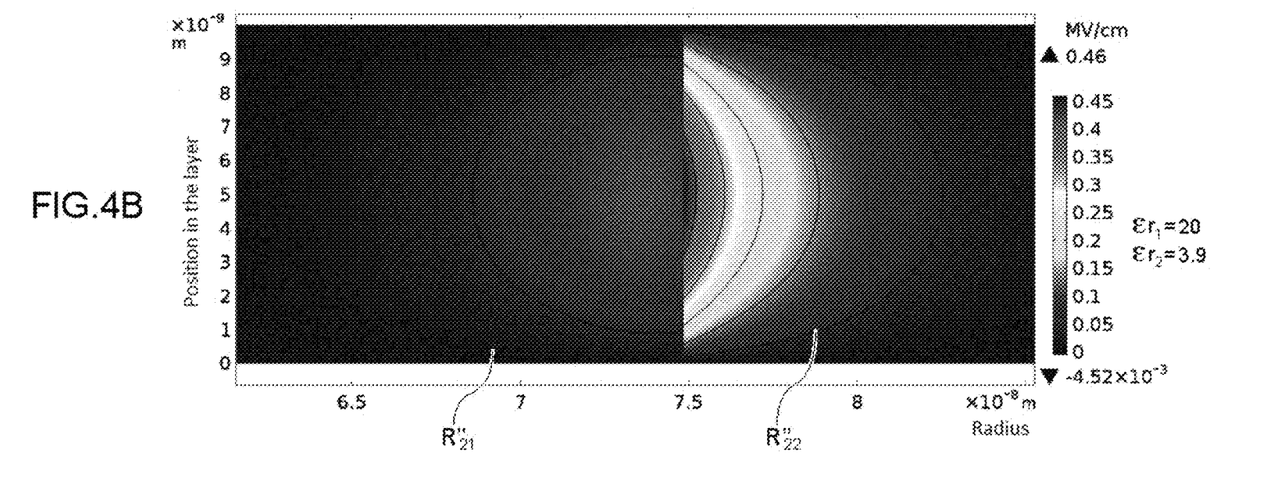

Other results of simulation of radial component of electric field are given in FIGS. 4A and 4B respectively for a first cell having an interface between a first region $R'_{21}$ having a dielectric constant $k'_1$=3.9 and a second region $R'_{22}$ having a dielectric constant $k'_2$=20, and for a second cell with an interface between a first region $R''_{21}$ having a dielectric constant $k''_1$=20 and a second region $R''_{22}$ having a dielectric constant $k''_2$=3.9. It is thus noted that the spatial extension of the radial electric field depends on the difference in dielectric constant between the regions in contact with one another and forming the interface where the switching zone is located.

Figure 5A:
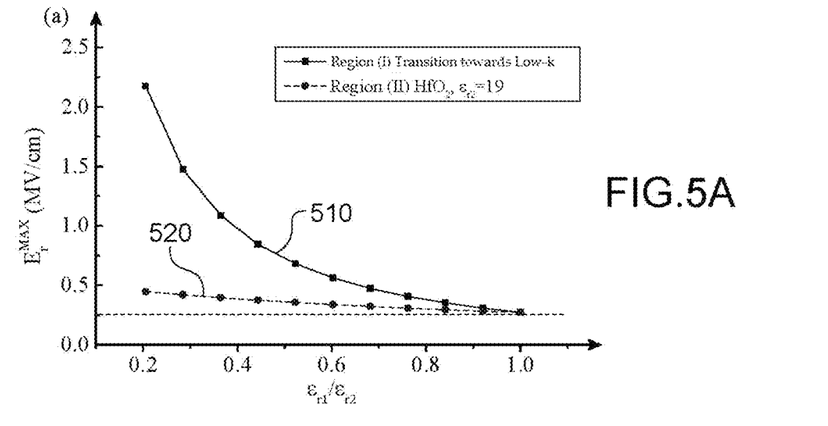
FIGS. 5A-5C are used to illustrate the effect on the radial electric field of the difference in dielectric constant between the first and the second dielectric region of a cell according to the invention.
Figure 5B:
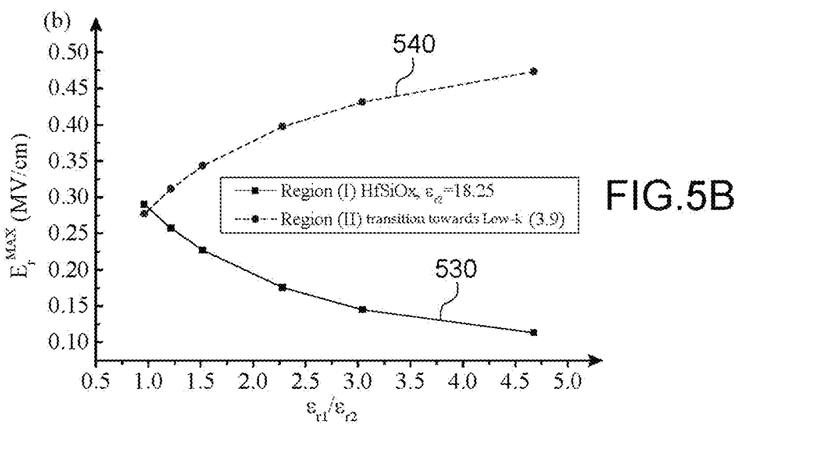
Figure 5C:
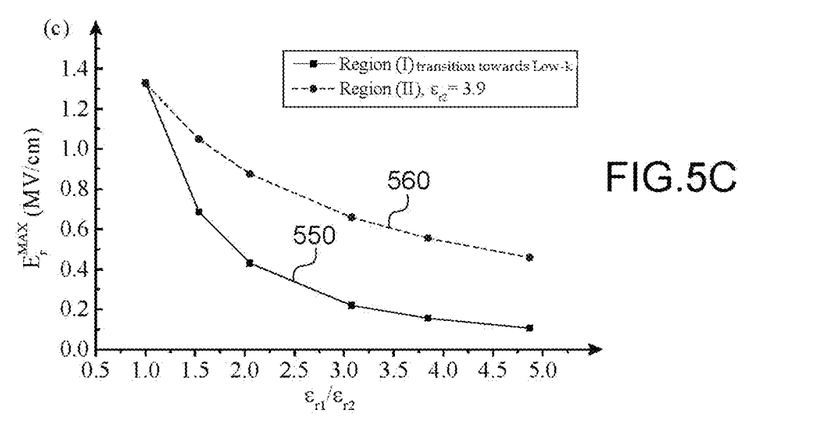

FIGS. 5A, 5B, 5C each give curves of simulation results giving the change in a maximum radial electric field in a cell structure as described above according to the dielectric constant ratio between the first dielectric region which is doped here and the second region which is not doped.

In FIG. 5A, the first region (curve 510) has a dielectric constant that varies to approach the behaviour of a low-k dielectric, while the second region (curve 520) adjoining the first region is made of non-doped hafnium oxide having a dielectric constant equal to 19.

In FIG. 5B, the first region (curve 530) is made of hafnium oxide doped with silicon with a dielectric constant of approximately 18.25, while the second region (curve 530) has a dielectric constant that varies to approach the behaviour of a low-k dielectric.

In FIG. 5C, the first region 550 has a dielectric constant that varies to approach the behaviour of a low-k dielectric, while a second region 560 adjoining the first region is provided with a dielectric constant of 3.9.

It is thus noted that as soon as a difference in dielectric constant exists between the first and the second region, an exacerbation of the radial electric field is obtained, and that this phenomenon is greater as the dielectric constant ratio between the two regions increases.

Figure 6:
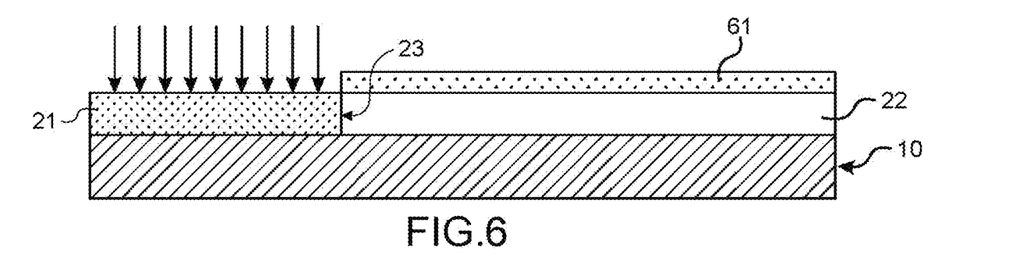
FIG. 6 is used to illustrate the formation of a dielectric region doped by implantation in the context of creating a cell having an arrangement according to the invention.

A particular manner of manufacturing an interface 23 of a memory cell as described above formed by regions 21, 22 juxtaposed and in contact with one another is illustrated in FIG. 6.

Starting from a structure including the layer of dielectric material 20 arranged on the lower electrode 10, the first region 21 is doped using an implantation or several successive implantations. The implantation(s) are carried out in a dielectric layer 20, while a second region 22 of this layer 20 is preserved during this implantation, typically via a mask 61 arranged on the second region 22.

For example, to dope a layer 20 of hafnium oxide approximately 10 nm thick at an atomic concentration of silicon between 1% and 5%, an implantation carried out at an energy of 4 keV, with a dose of between $1*10^{15}$ atoms*cm-2 and $5*10^{15}$ atoms*cm-2 can be carried out. Then, the mask 61 is removed.

The juxtaposed regions 21, 22 and thus the interface 23 between these regions 21, 22 intended to form the switching zone can advantageously be created without carrying out annealing for diffusion of dopants after the implantation.

The upper electrode is then created facing the interface 23 between an implanted region and a non-implanted region, and optionally centred facing this interface 23.

Figure 7A:
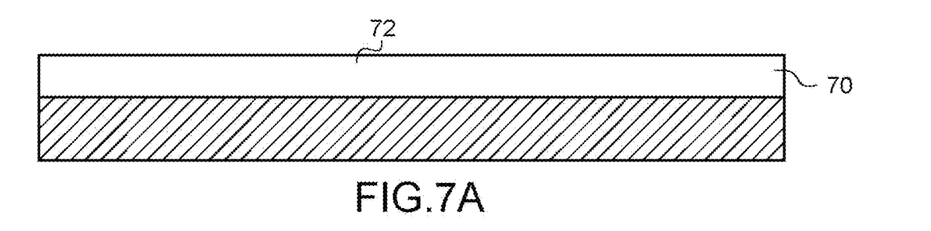
FIGS. 7A-7C are used to illustrate the formation of joined dielectric regions containing different materials in the context of creating a cell having an arrangement according to the invention.
Figure 7B:
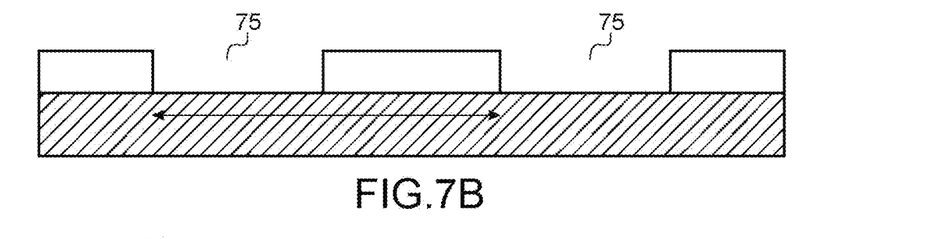
Figure 7C:
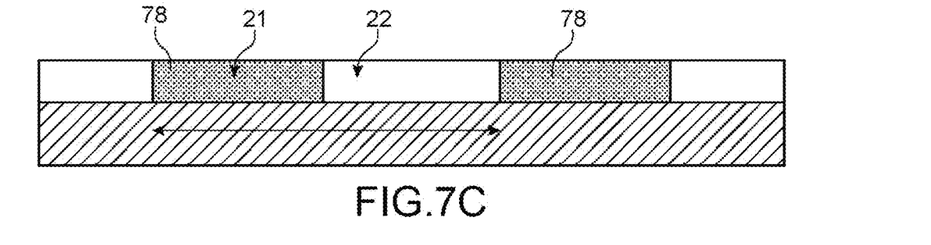

An embodiment of a structure having an interface 23 as described above with this time different dielectric materials is illustrated in FIGS. 7A-7C.

After the deposition (FIG. 7A) of a layer 70 of a first dielectric material 72, for example made of silicon nitride, one or more openings 75 are formed in this layer 70 while exposing the lower electrode 10 (FIG. 7B).

The openings 75 can be made using a photolithography method during which a masking (not shown) is formed and through which an etching of the dielectric layer 70 is carried out.

Then, the opening(s) 75 are filled via another dielectric material 78, for example hafnium oxide. A CMP (for Chemical Mechanical Planarisation) planarisation can then be carried out in order to obtain a flat layer including at least one region 21 made of a dielectric material adjoining another region made of a dielectric material 22 having a dielectric constant different than that of the first material.

Figure 8:
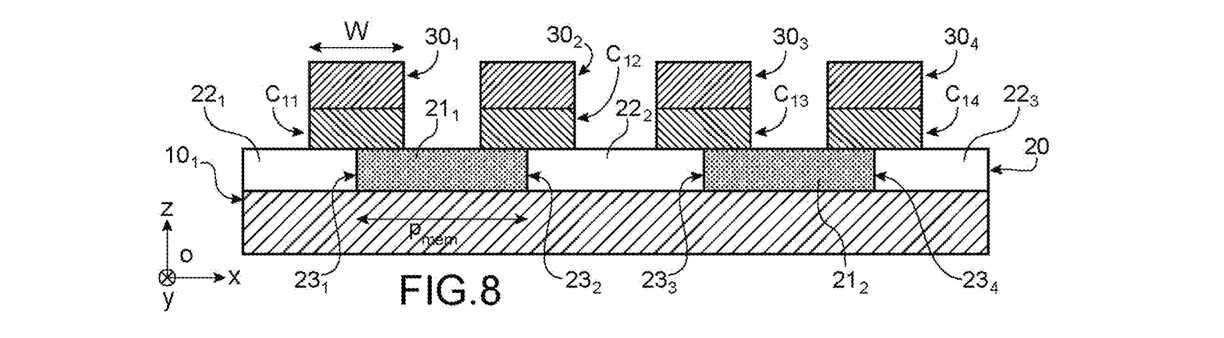
FIG. 8 is used to illustrate a resistive memory structure according to an embodiment of the present invention.

An arrangement of the resistive memory device with this time several memory cells $C_{11}, C_{12}, C_{13}, C_{14}$ is given in FIG. 8.

The memory array is here provided with distinct upper electrodes $30_1, 30_2, 30_3, 30_4$ that can be not connected to each other. These upper electrodes $30_1, 30_2, 30_3, 30_4$ are arranged respectively facing interfaces $23_1, 23_2, 23_3, 23_4$ between adjoining dielectric regions having different respective dielectric constants and/or different concentrations of doping element. The respective switching zones of the cells $C_{11}, C_{12}, C_{13}, C_{14}$ are thus also placed at the interfaces $23_1, 23_2, 23_3, 23_4$.

The dielectric layer 20 includes this time an alternation of regions $21_1, 21_2$, of a first type having a composition that can be similar to that of the first region 21 of the structure described above in relation to FIG. 1, and regions $22_1, 22_2, 22_3$, of a second type, having a composition and dielectric constant different than the first region. The regions $22_1, 22_2, 22_3$ can have a composition similar to that of the second region 22 described above in relation to FIG. 1.

Thus, the regions $22_1, 22_2, 22_3$ are for example non-doped regions of a layer made of hafnium oxide, while the regions $21_1, 21_2$ are for example regions implanted with silicon in this layer of hafnium oxide.

An upper electrode $30_1$ and another upper electrode $30_2$ are disposed here partly facing the same dielectric region $21_1$ of the first type, for example of doped oxide of a transition metal, and partly facing two dielectric regions $22_1, 22_2$ of the second type, while being placed facing distinct interfaces $23_1, 23_2$. The electrodes $30_1, 30_2$ can thus allow to power distinct switching zones.

Likewise, another upper electrode $30_3$ and the upper electrode $30_2$ are placed partly overlapping on the same dielectric region $22_2$, for example of non-doped oxide of a transition metal, while being disposed facing distinct interfaces $23_2, 23_3$ of distinct switching zones.

Such arrangements allow in particular to be able to create memories having small dimensions while having reduced constraints with regard to their dimensioning, in particular with regard to the pitch $p_{mem}$ of distribution of the memory cells $C_{11}, C_{12}, C_{13}, C_{14}$ as well as the width W of the electrodes. At an equal cell dimension, a pitch twice as large can be obtained while having an increased electrode width W with respect to a device according to the prior art.

At an equal cell dimension, the fact of providing electrodes having a greater width W can allow to relax the constraints of tolerance of misalignment between a given level of the microelectronic device in which the memory cells $C_{11}, C_{12}, C_{13}, C_{14}$ are formed and a level above and/or below the given level. This can also allow to facilitate the contact on the electrodes and make the design of the cells easier in terms of arrangement constraint.

Like in the embodiment described above, the upper electrodes $30_1, 30_2, 30_3, 30_4$ can be centred respectively facing the zones $23_1, 23_2, 23_3, 23_4$. There can also be a single switching zone per cell, so that two distinct upper electrodes $30_1, 30_2$ allow to control two distinct switching zones of two distinct cells.

In the specific embodiment illustrated in FIG. 8, a single lower electrode $10_1$ is shown but the device can also be provided with additional lower electrodes (not shown) typically parallel to each other. The lower and upper electrodes here have different respective orientations. Thus, in the specific embodiment illustrated in FIG. 8, the memory follows an arrangement of the crossbar type.

The upper electrodes $30_1, 30_2, 30_3, 30_4$ thus extend in parallel to a given direction, in this example parallel to the axis y of the reference frame [O; x; y; z], while the lower electrode(s) $10_1$ extend in parallel to another direction, orthogonal to said given direction and in this example parallel to the axis x.

In the embodiment illustrated, it is the upper electrodes $30_1, 30_2, 30_3, 30_4$ that have an orientation that follows that of the interface zones $23_1, 23_2, 23_3, 23_4$, but it is also possible to provide an inverse arrangement in which the lower electrodes $10_1, 10_2, 10_3, 10_4$ are oriented in a direction parallel to that in which the interface zones $23_1, 23_2, 23_3, 23_4$, the upper electrodes thus being orthogonal to the lower electrodes.

Types of arrangements of electrodes other than an arrangement of the crossbar type are possible.

Figure 9:
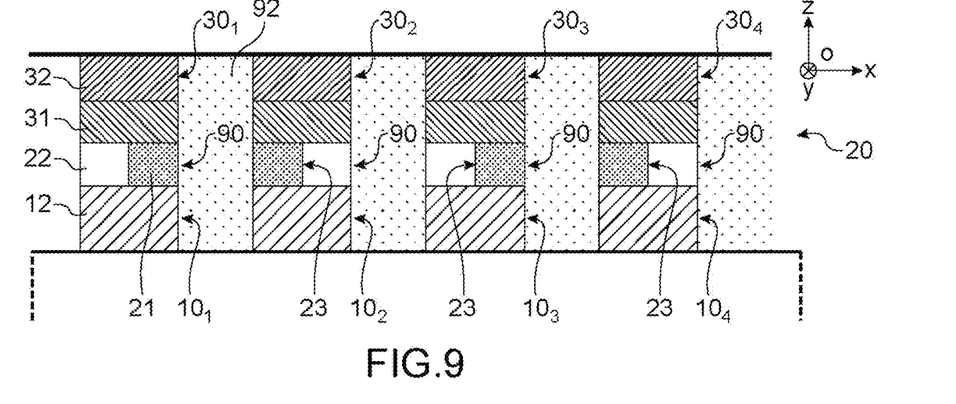
FIG. 9 is used to illustrate a resistive memory structure according to another embodiment of the present invention.

Thus, in the embodiment illustrated in FIG. 9, the upper electrodes $30_1, 30_2, 30_3, 30_4$, and the lower electrodes $10_1, 10_2, 10_3, 10_4$, of the resistive memory cells follow this time the same orientation. Each pair of upper and lower electrodes is distributed here symmetrically on either side of a block 90 of dielectric material including an interface 23 between a dielectric region 21 and an adjoining dielectric region 22 having a different dielectric constant and/or different doping. The pairs of electrodes $10_1, 30_1, 10_2, 30_2, \ldots$, are separated here from each other by trenches filled with insulating material 92, for example SiN silicon nitride or $SiO_2$.

To carry out a memory device as described above, one can start from a support formed by a substrate, of the bulk type or of the semiconductor on insulator type for example SOI on which at least one stage of transistors is created.

According to a specific embodiment illustrated in FIGS. 10A-10F, the memory device is manufactured during a set of back-end steps above the level of the transistors and at least one stage of already-formed connection elements.

First of all (FIGS. 10A and 10B giving a top view of the device) a plurality of parallel conductive lines $110_1, \ldots 110_7$ is created by depositing on this stage (schematically shown by a block 100 shown in dotted lines in FIG. 10A) a conductive material 112 for example containing TiN having a thickness than can be between for example 10 nm and 300 nm.

Figure 10A:
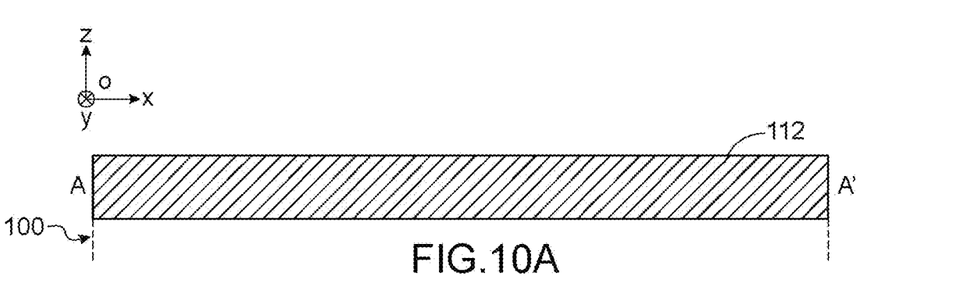
FIGS. 10A-10F are used to illustrate an example of a method for manufacturing a memory device according to the invention.
Figure 10B:
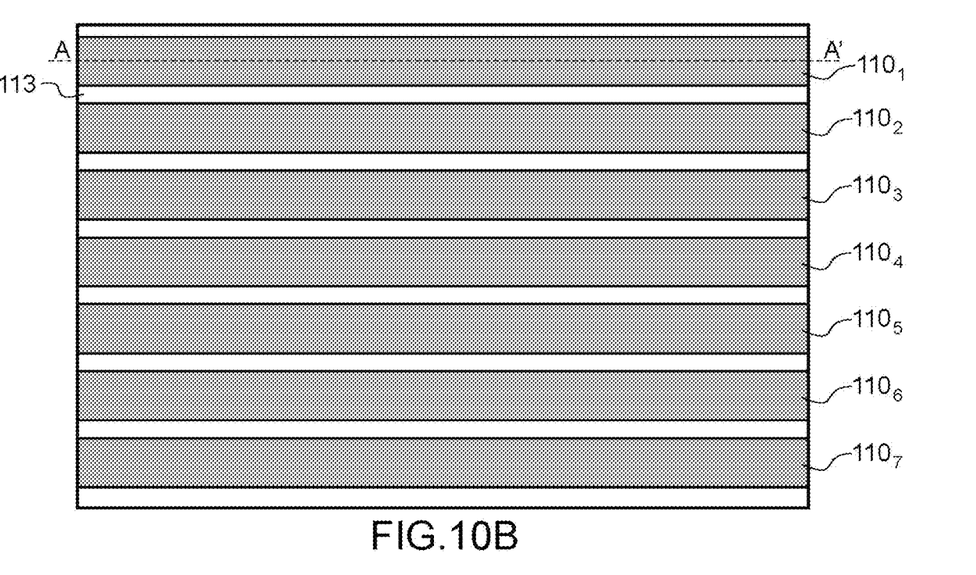
Figure 10C:
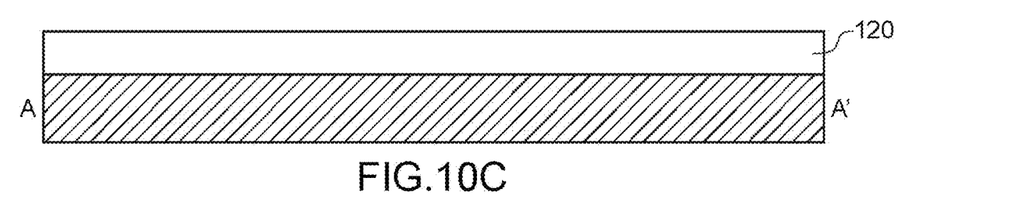
Figure 10D:
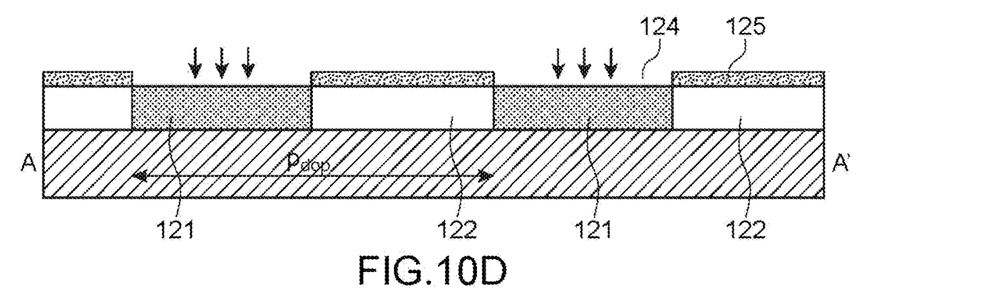
Figure 10E:
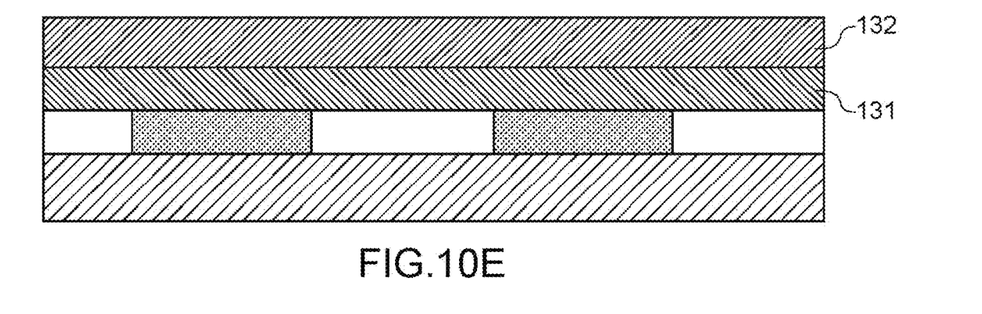
Figure 10F:
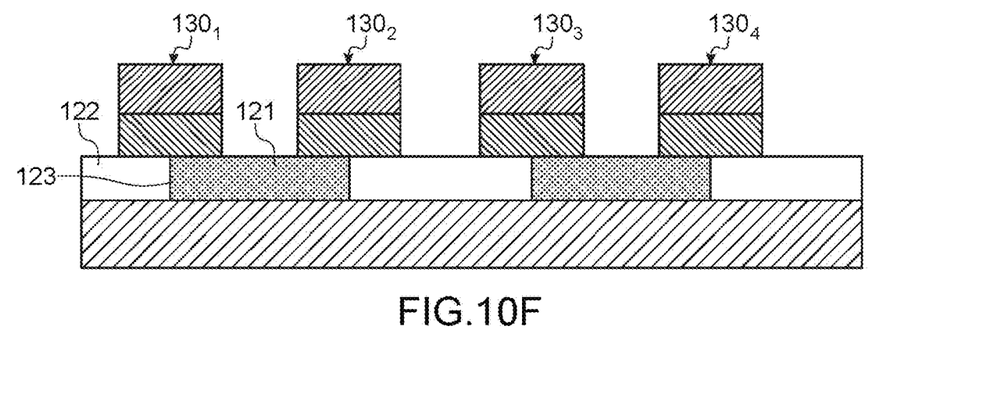

The parallel conductive lines $110_1, \ldots 110_7$ can be formed by etching or by filling of trenches. Insulating zones 113, for example made of silicon oxide, are provided between the conductive lines.

Then (FIG. 10C), at least one layer 120 of dielectric material for example such as hafnium oxide or tantalum oxide is deposited according to a thickness that can be between for example 3 nm and 25 nm.

Then (FIG. 10D), in this layer 120 of oxide, doped regions 121 are created by carrying out one or more successive implantations. In the case in which the layer of dielectric material 120 is a layer of oxide of transition metal such as hafnium oxide or tantalum oxide, an implantation of silicon or of aluminium can be carried out. Typically, the implantation is carried out through openings 124 of a mask 125, which is then removed. The openings 124 of the mask 125 can be in the form of oblong trenches, for example rectangular, in such a way as to create doped regions 121 having a corresponding shape. The doped regions 121 can be distributed regularly according to a pitch $p_{dop}$ two times greater than that of the memory points. The pitch of distribution of the memory points can correspond to that of the interfaces between doped regions 121 and non-doped regions 122.

Then (FIG. 10E), a conductive stack provided with a layer 131 made of oxygen scavenger material, for example containing Ti, and having a thickness that can be between for example 3 nm and 20 nm is created. The stack also includes a layer 132 of conductive material, for example made of TiN, deposited on the oxygen scavenger material and having a thickness that can be between for example 5 nm and 300 nm.

Then (FIG. 10F), patterns are formed by photolithography in the conductive stack, so as to create the upper electrodes $130_1, 130_2, 130_3, 130_4$, facing interfaces $123_1, 123_2, 123_3, 123_4$ between regions 121 of doped oxide and regions 122 of non-doped oxide.

Figure 11:
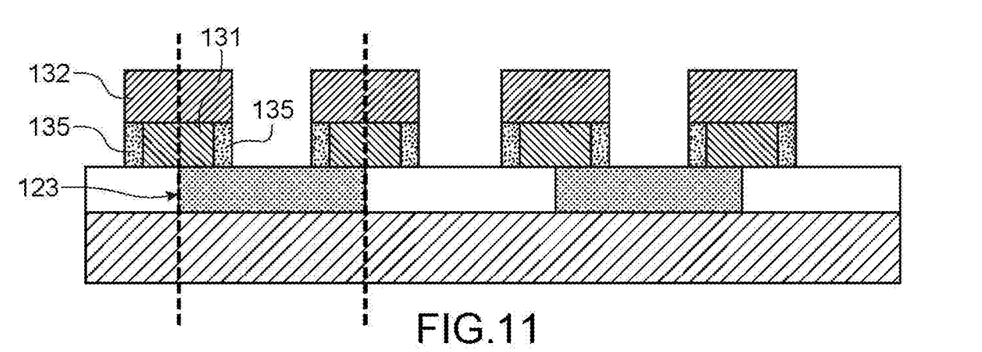
FIGS. 11 and 12 are used to illustrate specific configurations of electrodes.

The etching of the layers 131, 132 to form the upper electrode 130, in particular of the layer of oxygen scavenger material, typically containing Ti, can, as illustrated in FIG. 11, lead to a formation of oxidised zones 135 at the lateral sides of the electrodes $130_1, 130_2, 130_3, 130_4$. In this case, with respect to cells according to the prior art, the impact of such oxidised zones 135 on the operation of the cells is lesser insofar as the switching zone here is provided at the interface 123, in other words at a distance from the oxidised zones 135.

Figure 12:
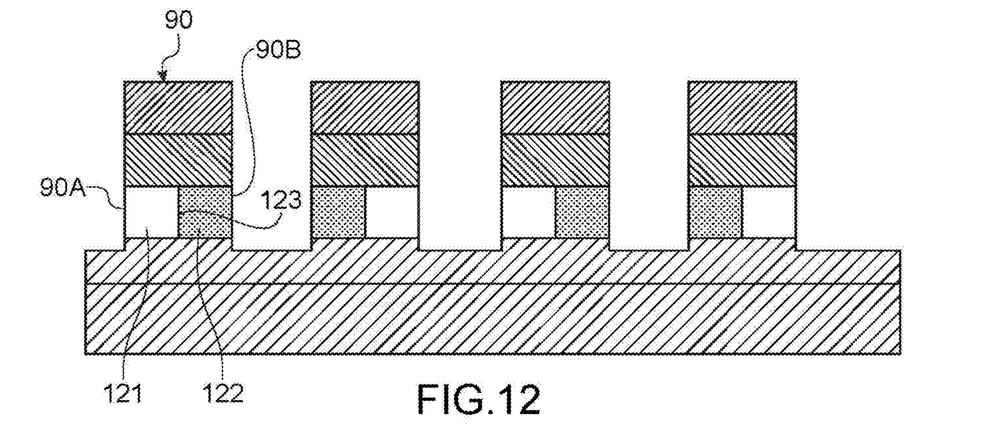

According to an alternative embodiment illustrated in FIG. 12, an anisotropic etching is carried out to create the upper electrodes 130 that is then continued in the layer of dielectric material 120 and in the layer(s) forming the lower electrodes.

The regions 121 and 122 forming the interface 123 in which the switching zone is located stop in this case in the extension of the lateral sides of the upper electrodes. Such an arrangement with a dielectric layer etched in distinct blocks 90 each provided with an interface 123 does not, here again, disturb the operation of the switching zone insofar as the latter is located at a distance from lateral sides 90A, 90B of the blocks 90.

According to another alternative embodiment of the method described above, the doped regions 121 can be created in several steps by successive implantations, respectively through the openings of a masking that are oriented in a first direction, then through other openings of another masking that are oriented in a second direction orthogonal to the first direction.

The invention claimed is:

1. A resistive memory structure, comprising a memory cell comprising a first electrode and a second electrode arranged on either side of a dielectric layer, the memory cell being capable of reversibly switching between a "high resistance" state and a "low resistance" state, wherein the dielectric layer comprises a switching zone forming a preferred conduction path for the current when the memory cell is in the low resistance state, wherein the dielectric layer comprises a first region and a second region adjoining one another in such a way as to form an interface between the first and second regions, the first and second region (a) being made of the same dielectric material and having different compositions in terms of doping element(s) or concentration of doping element or (b) being respectively made of a first dielectric material and a second dielectric material having different respective dielectric constants, wherein the first electrode and the second electrode are arranged facing the interface between the first region and the second region, the interface extending in a given plane passing through the dielectric layer and passing through the electrodes so as to locate the switching zone at the interface zone, and (i) wherein the dielectric layer comprises an alternation of regions of a first type having a composition identical to the first region and regions of a second type and having the same composition as the second region, at least one given electrode out of the first electrode and second electrode being facing a single interface between a region of the first type and a region of the second type, or (ii) wherein the resistive memory structure further comprises a third electrode juxtaposed with, and distinct from, the second electrode, the third electrode being arranged facing another interface between the first region and a third region of the dielectric layer, the third region being juxtaposed with the first region and disposed so that the first region is located between the third region and the second region, the first region and the third region being made of the same dielectric material and having different compositions in terms of doping element(s) or concentration of doping element or being respectively made of a first dielectric material and a second dielectric material having different respective dielectric constants, or (iii) wherein the first region extends, in a direction parallel to a main plane of the dielectric layer, between the interface and a zone located facing a first lateral face of at least one given electrode out of the first electrode and second electrode, the second region extending, in a direction parallel to the main plane of the dielectric layer, between the interface and another zone facing a second lateral face of the given electrode opposite to the first lateral face, and the first electrode, the second electrode, and the insulating layer being surrounded by trenches filled with insulating material.

2. The resistive memory structure of claim 1, wherein one given electrode out of the first electrode and second electrode is centered facing the interface and extends facing a surface of the first region equal or substantially equal to a surface of the second region facing which this given electrode extends.

3. The resistive memory structure of claim 1, wherein (iii) the first region extends, in the direction parallel to the main plane of the dielectric layer, between the interface and the zone located facing the first lateral face of the at least one given electrode out of the first electrode and the second electrode, the second region extending, in the direction parallel to the main plane of the dielectric layer, between the interface and another zone facing the second lateral face of the given electrode opposite to the first lateral face, and the first electrode, the second electrode, and the insulating layer being surrounded by the trenches filled with the insulating material.

4. The resistive memory structure of claim 1, wherein (i) the dielectric layer comprises the alternation of regions of the first type having the composition identical to the first region and regions of the second type and having the same composition as the second region, at least one given electrode out of the first electrode and second electrode being facing the single interface between the region of the first type and the region of the second type.

5. The resistive memory structure of claim 1, wherein the dielectric layer comprise: hafnium oxide ($HfO_2$, $HfO_x$), tantalum oxide ($Ta_2O_5$, $Ta_xO_y$), tungsten oxide ($WO_x$), or Silicon oxide ($SiO_2$, $SiO_x$).

6. The resistive memory structure of claim 1, further comprising (ii) the third electrode juxtaposed with, and distinct from, the second electrode, the third electrode being arranged facing another interface between the first region and a third region of the dielectric layer, the third region being juxtaposed with the first region and disposed so that the first region is located between the third region and the second region, the first region and the third region being made of the same dielectric material and having the different compositions in terms of the doping element(s) or the concentration of the doping element or being respectively made of the first dielectric material and the second dielectric material having different respective dielectric constants.

7. The resistive memory structure claim 6, wherein the second region and the third region are made of the same dielectric material.

8. The resistive memory structure of claim 6, further comprising:
a fourth electrode juxtaposed with the second electrode and distinct from the third electrode,
wherein the fourth electrode is arranged facing another interface zone between the third region and a fourth region of the dielectric layer,
wherein the fourth region is juxtaposed with the third region, and disposed so that the third region is located between the fourth region and the second region, the fourth region comprising the same material as the first region.

9. The resistive memory structure of claim 6, wherein the first electrode extends in a direction parallel to a first direction,
wherein the second electrode and the third electrode extend in a direction parallel to a second direction, and
wherein the second direction is orthogonal to the first direction.

10. The resistive memory structure of claim 1, wherein the dielectric layer is a layer of oxide,
wherein the first region is a doped region of the layer of oxide using a first doping element, present according to a first atomic concentration,
wherein the second region is a non-doped region of the oxide, or
wherein the second region is a doped region of the oxide and comprising a second atomic concentration of the first doping element distinct from the first concentration, or
wherein the region is doped via a second doping element, that is distinct from the first doping element.

11. The resistive memory structure claim 10, wherein the first region is made of hafnium oxide doped with silicon or doped with aluminum, and
wherein the second region is made of:
non-doped hafnium oxide, or
hafnium oxide doped with silicon with a concentration of silicon lower than the concentration of silicon of the first region, or
hafnium oxide doped with silicon when the first region is made of hafnium oxide doped with aluminum.

12. The resistive memory structure of claim 10, wherein the dielectric layer is a transition metal oxide layer.

13. The resistive memory structure of claim 10, wherein the first doping element is silicon and the second doping element is aluminum.

14. The resistive memory structure of claim 10, wherein the first doping element is aluminum and the second doping element is silicon.

15. A method for creating a memory structure of claim 1, wherein the dielectric layer is a layer of transition metal oxide, the method comprising:
implanting, using silicon or aluminum, the layer of transition metal oxide, in such a way as to create the first region; then
forming, on the layer of transition metal oxide, the second electrode facing an interface zone between the first region and another zone that is non-doped or has a doping different than that of the first region.

16. A method for creating a memory structure of claim 1, wherein the dielectric layer is a layer comprising a first dielectric material, the method comprising:
forming one or more openings in the layer comprising the first dielectric material;
filing the one or more openings using the second dielectric material, different than the first dielectric material.

17. A resistive memory structure, comprising a memory cell comprising a first electrode and a second electrode arranged on either side of a dielectric layer, the memory cell being capable of reversibly switching between a "high resistance" state and a "low resistance" state,
wherein the dielectric layer comprises a switching zone forming a preferred conduction path for the current when the memory cell is in the low resistance state,
wherein the dielectric layer comprises a first region and a second region adjoining one another in such a way as to form an interface between the first and second regions, the first and second region being made of the same dielectric material and having different compositions in terms of doping element(s) or concentration of doping element, and
wherein the first electrode and the second electrode are arranged facing the interface between the first region and the second region, the interface extending in a given plane passing through the dielectric layer and passing through the electrodes so as to locate the switching zone at the interface zone.

18. The resistive memory structure of claim 17, wherein the first region is made of hafnium oxide doped with silicon or doped with aluminum, and wherein the second region is made of:
non-doped hafnium oxide, or
hafnium oxide doped with silicon with a concentration of silicon lower than the concentration of silicon of the first region, or
hafnium oxide doped with silicon when the first region is made of hafnium oxide doped with aluminum.

19. A method for creating a memory structure of claim 17, wherein the dielectric layer is a layer of transition metal oxide, the method comprising:
   implanting, using silicon or aluminum, the layer of transition metal oxide, in such a way as to create the first region; then
   forming, on the layer of transition metal oxide, the second electrode facing an interface zone between the first region and another zone that is non-doped or has a doping different than that of the first region.

20. A method for creating a resistive memory structure, the method comprising:
   forming one or more openings in a layer comprising a first dielectric material;
   filling the one or more openings using a second dielectric material different than the first dielectric material,
   wherein the resistive memory structure comprises a memory cell comprising a first electrode and a second electrode arranged on either side of a dielectric layer, the memory cell being capable of reversibly switching between a "high resistance" state and a "low resistance" state,
   wherein a dielectric layer, which is the layer comprising the first dielectric material, comprises a switching zone forming a preferred conduction path for the current when the memory cell is in the low resistance state,
   wherein the dielectric layer comprises a first region and a second region adjoining one another in such a way as to form an interface between the first and second regions, the first and second region (a) being made of the same dielectric material and having different compositions in terms of doping element(s) or concentration of doping element or (b) being respectively made of a first dielectric material and a second dielectric material having different respective dielectric constants, and
   wherein the first electrode and the second electrode are arranged facing the interface between the first region and the second region, the interface extending in a given plane passing through the dielectric layer and passing through the electrodes so as to locate the switching zone at the interface zone.

* * * * *